United States Patent [19]

Miyata

[11] Patent Number: 4,491,800
[45] Date of Patent: Jan. 1, 1985

[54] SWITCHING CIRCUIT OPERABLE AS AN AMPLIFIER AND A MUTING CIRCUIT

[75] Inventor: Shinji Miyata, Tokyo, Japan

[73] Assignee: NEC Corporation, Tokyo, Japan

[21] Appl. No.: 499,703

[22] Filed: May 31, 1983

[30] Foreign Application Priority Data

May 31, 1982 [JP] Japan .................................. 57-92585

[51] Int. Cl.³ ............................................. H03G 3/26
[52] U.S. Cl. ...................................... 330/51; 330/86; 330/282
[58] Field of Search .................... 330/51, 86, 110, 282

[56] References Cited

U.S. PATENT DOCUMENTS 4,034,308 7/1977 Wermuth et al. ............... 330/51 X
4,099,134 7/1978 Schroder ........................ 330/110 X Primary Examiner—James B. Mullins
Assistant Examiner—Steven J. Mottola
Attorney, Agent, or Firm—Sughrue, Mion, Zinn, Macpeak, and Seas

[57] ABSTRACT

A switching circuit for achieving the amplifying and muting operations is disclosed. The switching circuit operates as a non-inverting feedback amplifier whenever the circuit performs either amplification or muting. The non-inverting input port of the amplifier is always kept free to receive a given signal. An impedance element is connected to the output terminal of the circuit in either the amplifying or muting operation.

9 Claims, 6 Drawing Figures

SWITCHING CIRCUIT OPERABLE AS AN AMPLIFIER AND A MUTING CIRCUIT

BACKGROUND OF THE INVENTION

The present invention relates to a switching circuit and, more particularly, to a switching circuit operable as an amplification circuit and a muting circuit.

A muting circuit finds its use in audio systems with a view to temporarily attenuating the signal level to be recorded or for attenuating the output thereof while no broadcast signal is received. In a conventional muting circuit, which may generally be composed of an integrated circuit free of a capacitor, a portion of a signal path is grounded through a switch circuit made of a transistor or the like, so that a given signal is not transmitted from said portion. The bias potential changes at the portion where the signal path is grounded to cause a clicking noise in the final output. Such clicking noise is also caused when the muted state is released, resulting in an unpleasant sound to the listener.

SUMMARY OF THE INVENTION

A principal object of the present invention is to provide a switching circuit suitable for switching between amplification and muting operations without causing an unpleasant noise.

According to one aspect of the invention, there is provided a switching circuit operable as an amplifier and a muting circuit and which comprises: an amplifier having a non-inverting input port for receiving input signals, an inverting input port, and an output port; a first impedance element connected between said inverting input port and ground potential; a second impedance element and a third impedance element connected to the inverting input port of the amplifier; an output terminal; and switching means, whereby, for the amplification operation, the switching means connects the output port of the amplifier, the other end of the second impedance element and the output terminal together, and for the muting operation, the switching means connects the output port of the amplifier and the other end of one of the second and third impedance elements together, and further connects said output terminal and the other end of the other of the second and third impedance elements together.

In either of the amplification and muting operations, the entire circuit functions as a non-inverting feedback amplifier. In the muting operation, however, one of the second and third impedance elements which is connected to the output port of the amplifier cooperates with the first impedance element to serve as an attenuator for the output of the amplifier, and the attenuated signal is further attenuated by an attenuator made of the other of the second and third impedance elements and a load impedance to provide a greatly decreased output at said output terminal. Thus, the amplifier operates as a noninverting feedback amplifier whenever the circuit performs either the amplification operation or the muting operation. The non-inverting input port is always kept free to receive the input signal. Therefore, the input bias voltage of the amplifier does not change. Further, when either the amplification function or the muting function is performed, the second or third impedance element is connected between said output terminal and the inverting input port of the amplifier. Therefore, the output bias voltage of the circuit does not change greatly. Accordingly, no clicking noise is generated when the function is switched.

BRIEF DESCRIPTION OF THE DRAWINGS

The above and further objects, features and advantages of the present invention will become more apparent from the following detailed description of the invention taken in conjunction with the accompanying drawings, wherein.

DETAILED DESCRIPTION OF THE INVENTION

Figure 1:
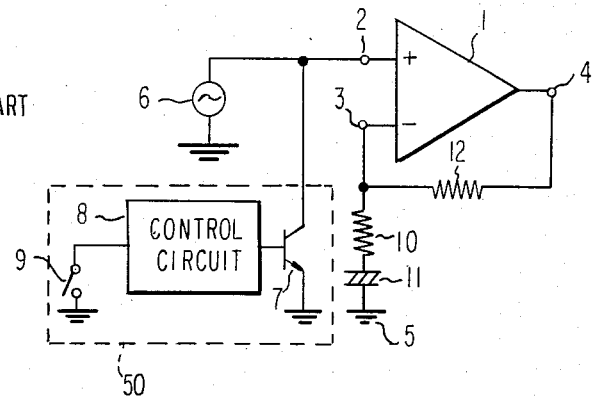
FIG. 1 is a diagram of a conventional amplifier circuit with a muting function.

Referring to FIG. 1, a conventional amplifier circuit with a muting function is generally provided with a modified non-inverting feedback amplifier. Specifically, a resistor 12 is connected between an output terminal 4 of an amplifier 1 and an inverting input terminal 3. A series circuit of a resistor 10 and a capacitor 11 is connected between terminal 3 and ground 5. A signal source 6 is connected between a non-inverting input terminal 2 and ground 5. Amplifier 1, resistors 10 and 12, capacitor 11, and signal source 6 constitute a non-inverting feedback amplifier. A muting switch circuit 50 consists of an NPN transistor 7, a control circuit 8, and a switch 9. The collector electrode of the NPN transistor 7 is connected to input terminal 2, the emitter electrode thereof is connected to ground 5, and the base electrode thereof is connected to a control circuit 8 which controls the operation of transistor 7. When switch 9 is open, the circuit 8 renders transistor 7 nonconductive. On the other hand, with the closure of the switch 9, the control circuit 8 renders transistor 7 conductive.

The muting operation of the circuit shown in FIG. 1 is attained by closing switch 9. The control circuit 8 operates so that transistor 7 becomes conductive. As a result, any signal from the signal source 6 is bypassed to ground 5 through transistor 7. The bias voltage at input terminal 2 is lowered to the collector saturation voltage of transistor 7. This change of the input bias voltage affects the amplifier 1 to cause clicking noise on the output derived from the output terminal 4. The change in the input bias voltage occurs also, when the muting operation is released by opening the switch 9, also causing a clicking noise.

Figure 2:
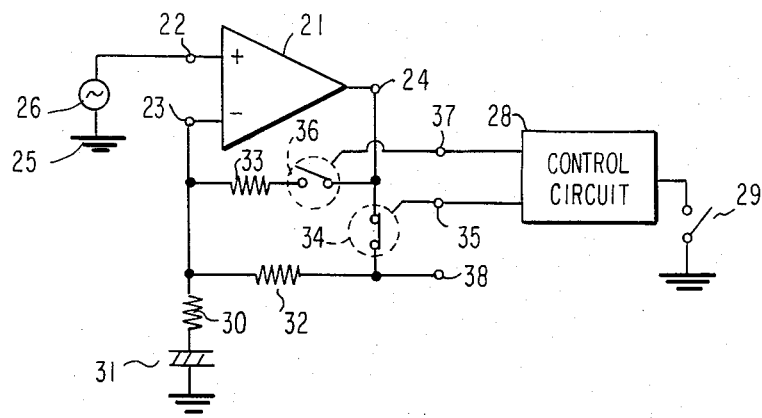
FIG. 2 is a circuit diagram of an embodiment of the present invention.

Referring to FIG. 2, which shows one embodiment of the invention, a signal from an input signal source 26 is supplied to a non-inverting input port 22 of the amplifier 21. An inverting input port 23 is connected to ground 25 via a series circuit of a resistor 30 of 220 ohms and a capacitor 31 of 22 microfarads, for example. Resistors 32 and 33 (of 22 kiloohms, for example) are connected to the port 23. The other end of the resistor 32 is connected to an output terminal 38 and an output port 24 of the amplifier 21 via a first switch 34. The other end of the resistor 33 is also connected to the port 24 via a second switch 36. The operations of switches 34 and 36 are controlled by signals applied to terminals 35 and 37 from a control circuit 28. In response to the opening of the switch 29, control circuit 28 generates signals at terminals 35 and 37 so that the first switch 34 is closed and the second switch 36 is opened. On the other hand, with the closure of switch 29, control circuit 28 produces signals at terminals 35 and 37 so that the first switch 34 is opened and the second switch 36 is closed.

Figure 3:
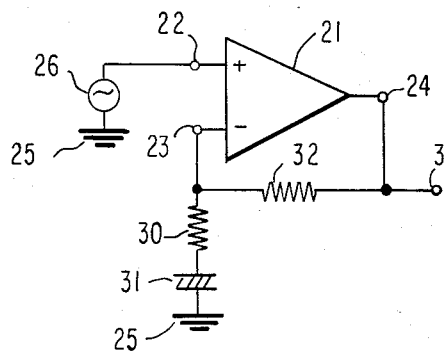
FIG. 3 is a circuit diagram for describing the amplifying operation of the invention.

The normal state, in which the muting switch 29 is opened, the first switch 34 is closed, and the second switch 36 is opened, is illustrated by the equivalent circuit of FIG. 3. In this condition a d-c (direct current) negative feedback signal is applied to port 23 from output port 24 via resistor 32. The circuit, therefore, functions as a non-inverting feedback amplifier.

Figure 4:
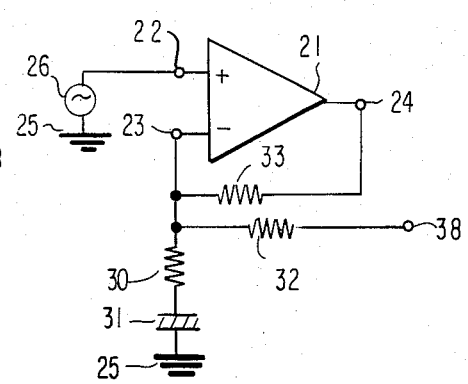
FIG. 4 is a circuit diagram for describing the muting operation of the invention.

When the muting switch 29 is closed, the first switch 34 is opened, and the second switch 36 is closed. The resulting equivalent circuit is shown in FIG. 4. In this condition, a d-c negative feedback is applied to port 23 from port 24 via the resistor 33. Here, however, the output from terminal 24 is attenuated by voltage divider 33, 30 and then by a voltage divider consisting of resistor 32 and a load resistor not shown, resulting in a greatly attenuated signal at output terminal 38. Thus, the muting function is accomplished.

The change in the d-c bias potentials at the input ports 22 and 23 of the amplifier 21 are very slight between the amplification operation and the muting operation. This is because the switching between the amplifying and muting operations does not affect the circuit condition of the port 22. Also, the change in the d-c bias potential at the output terminal 38 is very slight since the resistor 32 or 33 is always connected between the terminal 38 and the terminal 23. The latter effect can be obtained more reliably by selecting the resistance of resistors 32 and 33 to be equal. As mentioned above, the change of the d-c bias potentials at the ports 22, 23 and the terminal 38 is very little in response to switching between the amplification and muting operations. Therefore, no clicking noise results even though the circuit operation is altered.

Figure 5:
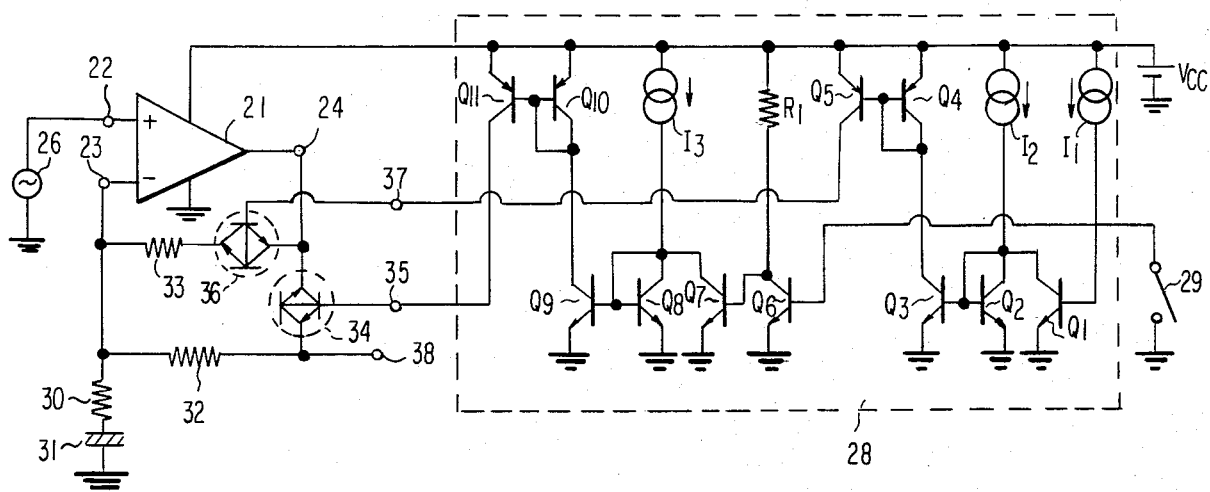
FIG. 5 is a diagram for illustrating a practical integrated circuit structure of the embodiment shown in FIG. 2.

FIG. 5 is a circuit diagram for a practical circuit structure of the embodiment shown in FIG. 2. In FIG. 5, identical structural elements to those of FIG. 2 are denoted by the same reference numerals and their descriptions are omitted. Each of the first and second switches 34 and 36 is made of two parallel connected NPN transistors. In each switch, the base electrodes of the two transistors are commonly connected and the collector electrode of each transistor is connected to the emitter electrode of the other. The common base electrodes of switches 34 and 36 are connected to the terminals 35 and 37, respectively. Each of the switches 34 and 36 passes an AC signal such as an audio signal when it is conductive. The switches, made of two parallel connected transistors, has the same conductive impedance and the same voltage drop for both positive and negative parts of the AC signal.

The control circuit 28 which supplies control signals to the terminals 35, 37, consists of transistors $Q_1$ to $Q_{11}$, constant-current sources $I_1$ to $I_3$, and a resistor $R_1$. The muting switch 29 controls a base current of the transistors $Q_1$ and $Q_6$. If the switch 29 is open, a constant current from the current source $I_1$ flows into the transistors $Q_1$ and $Q_6$ to render them conductive. A current from the current source $I_2$ flows to ground through transistor $Q_1$ so as to render the transistors $Q_2$ to $Q_5$ non-conductive. As a result, the base electrodes of the transistors in the second switch 36 do not receive any current, so that the second switch 36 is opened. On the other hand, since a current flowing through the resistor $R_1$, flows to ground through transistor $Q_6$, transistor $Q_7$ is rendered non-conductive. Current from the current source $I_3$ therefore turns on transistors $Q_8$ and $Q_9$, which in turn, render transistors $Q_{10}$ to $Q_{11}$ conductive. Accordingly, transistor $Q_{11}$ supplies base current to the transistors in the first switch 34 through the terminal 35 so that switch 34 is closed. As shown in FIG. 3, therefore, the entire circuit including the amplifier 21 functions as a non-inverting feedback amplifier to amplify the input signal. If the muting switch 29 is closed, thereby grounding the base electrodes of transistors $Q_1$ and $Q_6$, the conductivity of all transistors $Q_1$ through $Q_{11}$ is the opposite of that described above, resulting in current not being supplied to terminal 35 but being supplied to the terminal 37. The states of the two switches 34 and 36 are reversed and the amplifier functions as a muting circuit as shown in FIG. 4.

The circuit shown in FIG. 5 may be constructed as a semiconductor integrated circuit. Such integrated circuit includes all the circuit elements other than resistors 30 and 32, capacitor 31, and switch 29. The input signal source 26 and the power supply source Vcc are, of course, added to the integrated circuit. The integrated circuit requires three external terminals 22, 23, and 38, in addition to the external terminals to be connected to the switch 29, the power supply source Vcc, and the ground potential.

Figure 6:
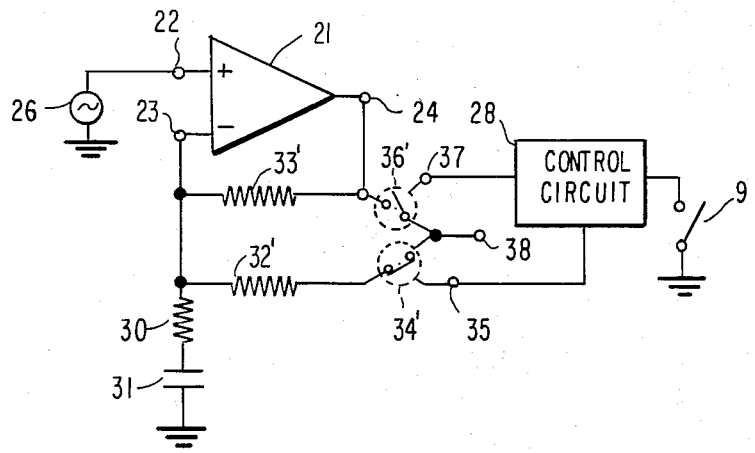
FIG. 6 is a circuit diagram of another embodiment of the invention.

FIG. 6 shows another embodiment of the invention, in which a resistor 33' always remains connected between the inverting input port 23 and the output port 24 of the amplifier 21. The resistor 33' and the port 24 are connected to a second switch 36'. A resistor 32'10 is connected to a first switch 34'. The output terminal 38 is connected to the switches 34' and 36'. The switches 34' and 36' are controlled by the outputs of the control circuit 28 to switch the connection of the terminal 38.

It will be obvious that the circuit of FIG. 6 operates in the same manner as the embodiment of FIG. 2. In particular, since the resistor 33' is always connected to the amplifier 21, the operating condition of the amplifier 21 does not change even when any change between the amplification and muting operations is made. Hence, the resistance of resistor 32' can be selected irrespective of the operation of the amplifier 21, to obtain a desired attenuation factor. Desirably, however, it is also true that the resistances 32' and 33' should be selected to be equal to minimize the above-mentioned clocking noise.

In the above-mentioned embodiments, a single power supply source Vcc of positive polarity was used. Instead, two power supply sources of positive and negative polarities may be employed with the circuit structure with the feedback capacitor 31 eliminated.

What is claimed:
1. A switching circuit comprising:
 a signal input terminal;
 a signal output terminal;
 a reference potential terminal;
 an amplifier having an inverting input port, a non-inverting input port and an output port, and non-inverting input port being coupled to said signal input terminal;
 a first impedance element connected between said inverting input port and said reference terminal;

a second impedance element and a third impedance element connected at their one ends to said inverting input port; and switching means for establishing connection relations among said output port, said signal output terminal, the other end of said second impedance element and the other end of said third impedance element;

wherein said switching means performs the switching operation between a first state in which, while said other end of one of said second and third impedance elements is coupled to said output port, said other end of the other of said second and third impedance elements is coupled to said signal output terminal, and a second state in which said other end of one of said second and third impedance elements is coupled to said output port and said signal output terminal.

2. A circuit as claimed in claim 1, wherein said one of said second and third impedance elements in said first state and said one of said second and third impedance elements in said second state, are different impedance elements.

3. A circuit as claimed in claim 1, wherein said one of said second and third impedance elements in said first state and said one of said second and third impedance elements in said second state, are the same impedance elements.

4. A circuit operable as an amplifier and a muting circuit comprising;
 an input terminal;
 an output terminal;
 a reference terminal;
 an amplifier having a non-inverting input port, an inverting input port and an output port, said non-inverting input port being coupled to said input terminal;
 a first resistor coupled between said inverting input port and said reference terminal;
 a second resistor having one end connected with said inverting input port;
 a third resistor having one end connected with said inverting input port and the other end coupled to said output terminal;
 a first switch inserted between the other end of said second resistor and said output port;
 a second switch inserted between the other end of said third resistor and said output port; and
 means for controlling said first and second switches so that only one of them is conductive at a time.

5. A circuit as claimed in claim 4, wherein said inverting input port is coupled to said reference terminal through said first resistor and a capacitor.

6. A circuit as claimed in claim 5, wherein each of said first and second switches is made of two parallel connected transistors, the collector electrode of one of said transistors being connected to the emitter electrode of the other of said transistors, and the base electrodes of said transistors being coupled together and to said control means.

7. A circuit operable as an amplifier and a muting circuit comprising:
 an input terminal;
 an output terminal;
 a reference terminal;
 an amplifier having a non-inverting input port, an inverting input port and an output port, said non-inverting input port being coupled to said input terminal;
 a first resistor coupled between said inverting input port and said reference terminal;
 a second resistor having one end connected with said inverting input port and the other end connected with said output port;
 a third resistor having one end connected with said inverting input port;
 a first switch inserted between the other end of said second resistor and said output terminal;
 a second switch inserted between the other end of said third resistor and said output terminal; and
 means for controlling said first and second switches so that only one of them is conductive at a time.

8. A circuit as claimed in claim 7, wherein said inverting input port is coupled to said reference terminal through said first resistor and a capacitor.

9. A circuit as claimed in claim 8, wherein each of said first and second switches is made of two parallel connected transistors, the collector electrode of one of said transistors being connected to the emitter electrode of the other of said transistors, and the base electrodes of said transistors being coupled together and to said control means.

* * * * *

UNITED STATES PATENT AND TRADEMARK OFFICE
CERTIFICATE OF CORRECTION

PATENT NO. : 4,491,800
DATED : Jan. 1, 1985
INVENTOR(S) : Shinji MIYATA

It is certified that error appears in the above-identified patent and that said Letters Patent is hereby corrected as shown below:

Column 4, line 9, after "which" insert a --,--;

line 37, change "32'10" to --32'--.

Signed and Sealed this

Twenty-second Day of October 1985

[SEAL]

Attest:

DONALD J. QUIGG

Attesting Officer

Commissioner of Patents and
Trademarks—Designate